United States Patent
Qiao et al.

(10) Patent No.: US 11,639,970 B2
(45) Date of Patent: May 2, 2023

(54) METHOD AND APPARATUS FOR DETERMINING STATE OF POWER OF BATTERY SYSTEM

(71) Applicants: CALB Co., Ltd., Jiangsu (CN); CALB TECHNOLOGY CO., LTD., Jiangsu (CN)

(72) Inventors: Peipei Qiao, Luoyang (CN); Huaitao Wang, Changzhou (CN)

(73) Assignees: CALB Co., Ltd., Jiangsu (CN); CALB TECHNOLOGY CO., LTD., Jiangsu (CN)

( * ) Notice: Subject to any disclaimer, the term of this patent is extended or adjusted under 35 U.S.C. 154(b) by 342 days.

(21) Appl. No.: 17/013,650

(22) Filed: Sep. 6, 2020

(65) Prior Publication Data
US 2021/0199726 A1   Jul. 1, 2021

(30) Foreign Application Priority Data
Dec. 31, 2019   (CN) .......................... 201911425010.9

(51) Int. Cl.
*H01M 10/48* (2006.01)
*G01R 31/392* (2019.01)
*G01R 31/3835* (2019.01)
*G01R 31/374* (2019.01)

(52) U.S. Cl.
CPC ......... *G01R 31/392* (2019.01); *G01R 31/374* (2019.01); *G01R 31/3835* (2019.01); *H01M 10/48* (2013.01)

(58) Field of Classification Search
CPC .......................... G01R 31/3647; G01R 31/367; G01R 31/374; G01R 31/3835; G01R 31/389; G01R 31/392; H01M 10/48; Y02E 60/10
See application file for complete search history.

(56) References Cited

U.S. PATENT DOCUMENTS

2014/0372053 A1   12/2014   Lin et al.
2016/0039419 A1   2/2016   Wampler et al.

FOREIGN PATENT DOCUMENTS

| CN | 103675707 | 3/2014 |
|----|-----------|--------|
| CN | 105301509 | 2/2016 |
| CN | 107024659 | 8/2017 |
| CN | 108162968 | 6/2018 |
| CN | 108227817 | 6/2018 |
| CN | 109284563 | 1/2019 |

(Continued)

OTHER PUBLICATIONS

"Office Action of China Counterpart Application" with English translation thereof, dated Aug. 30, 2021, p. 1-p. 13.

(Continued)

*Primary Examiner* — Victoria H Lynch
(74) *Attorney, Agent, or Firm* — JCIP Global Inc.

(57) ABSTRACT

The disclosure discloses a method and an apparatus for determining a state of power (SOP) of a battery system. With the method and apparatus, battery health state indexes determined according to the internal resistance and the current power of the battery system may serve as a calibration index, and the initial power parameters may be calibrated by using the calibration index. The internal resistance of the battery reflects the aging property of the battery system. Therefore, in the disclosure, the initial power parameters are calibrated according to the aging property of the battery system.

12 Claims, 8 Drawing Sheets

(56) References Cited

FOREIGN PATENT DOCUMENTS

| | | |
|---|---|---|
| CN | 110031767 | 7/2019 |
| EP | 1283425 | 2/2003 |

OTHER PUBLICATIONS

"Search Report of Europe Counterpart Application", dated Mar. 10, 2021, p. 1-p. 10.
"Office Action of China Related Application No. 201911419478.7", dated Dec. 1, 2020, with partial English translation thereof, pp. 1-9.

METHOD AND APPARATUS FOR
DETERMINING STATE OF POWER OF
BATTERY SYSTEM

CROSS-REFERENCE TO RELATED
APPLICATION

This application claims the priority benefit of China application serial no. 201911425010.9, filed on Dec. 31, 2019. The entirety of the above-mentioned patent application is hereby incorporated by reference herein and made a part of this specification.

BACKGROUND

Technical Field

The disclosure relates to a battery, and particularly relates to a method and an apparatus for determining a state of power (SOP) of a battery system.

Description of Related Art

The state of power (SOP) of a battery system is an important control parameter in battery management, and serves to represent the capability of the battery system for supplying power. SOP is determined to cope with the performance and the power demands of an electric vehicle as well as the lifetime of the battery system, so that the battery system can output a suitable power to satisfy the need of the vehicle for power when the electric vehicle is starting, accelerating, climbing uphill, etc. In addition, when the electric vehicle is braking, the electrical system needs to be able to regenerate a suitable amount of energy to increase the endurance of the vehicle while preventing the battery system from being excessively used, thereby increasing the lifetime of the battery system.

Accordingly, how to determine the SOP of a battery system is certainly an issue for researchers of relevant fields to work on.

SUMMARY

The embodiments of the disclosure provide a method and apparatus for determining a state of power (SOP) of a battery system. The method and apparatus are capable of determining the SOP of the battery system.

In the first aspect, an embodiment of the disclosure provides a method for determining a state of power (SOP) of a battery system. The method includes the following: determining initial power parameters of the battery system under different temperatures and different states of charge; determining battery health state indexes of the battery system according to an internal resistance and a current power of the battery system; and calibrating the initial power parameters according to the battery health state indexes to obtain the SOP of the battery system.

In the second aspect, an embodiment of the disclosure provides an apparatus for determining a state of power (SOP) of a battery system. The apparatus includes the following: a determiner, configured for determining initial power parameters of the battery system under different temperatures and different states of charge, and calibrating the initial power parameters according to battery health state indexes to obtain the SOP of the battery system; and a calibrator, configured for calibrating the initial power parameters according to the battery health state indexes to obtain the SOP of the battery system.

In the third aspect, an embodiment of the disclosure provides a battery system. A state of power (SOP) of the battery system is determined according to the method according to the embodiments of the disclosure.

With the method and apparatus for determining the SOP of the battery system, according to the embodiments of the disclosure, the battery health state indexes determined according to the internal resistance and the current power of the battery system may serve as a calibration index, and the initial power parameters may be calibrated by using the calibration index. The internal resistance of the battery reflects the aging property of the battery system. Therefore, in the embodiments of the disclosure, the initial power parameters are calibrated according to the aging property of the battery system.

BRIEF DESCRIPTION OF THE DRAWINGS

For a better understanding of the disclosure, reference may be made to exemplary embodiments shown in the following drawings. The components in the drawings are not necessarily to scale and related elements may be omitted, or in some instances proportions may have been exaggerated, so as to emphasize and clearly illustrate the features described herein. In addition, related elements or components can be variously arranged, as known in the art. Further, in the drawings, like reference numerals designate same or like parts throughout the several views.

DESCRIPTION OF THE EMBODIMENTS

The technical solutions in the exemplary embodiments of the disclosure will be described clearly and explicitly in conjunction with the drawings in the exemplary embodiments of the disclosure. The description proposed herein is just the exemplary embodiments for the purpose of illustrations only, not intended to limit the scope of the disclosure, so it should be understood that and various modifications and variations could be made thereto without departing from the scope of the disclosure.

In the description of the present disclosure, unless otherwise specifically defined and limited, the terms "first", "second" and the like are only used for illustrative purposes and are not to be construed as expressing or implying a relative importance. The term "plurality" is two or more. The term "and/or" includes any and all combinations of one or more of the associated listed items.

In the following, descriptions will be made in detail about the examples of a method and an apparatus for determining a state of power (SOP) of a battery system according to the embodiments of the disclosure with reference to the accompanying drawings. It should be noted that the embodiments described herein are merely some, instead of all, of the embodiments of the disclosure. Other embodiments attained by people skilled in the art based on the embodiments of the disclosure without creative labor shall still fall within the scope of the disclosure.

The inventors found, through research, that the tests for SOP are mostly conducted based on the Hybrid Pulse Power Characteristic (HPPC) test proposed in the Freedom CAR project by the Department of Energy of the United States. By applying a specific discharge pulse power (for 30 s, for example) and a specific charge pulse power (for 10 s, for example) to a battery system under different temperatures and different states of charge (SOCs), the corresponding discharge voltage (i.e., $U_{min}$) and the corresponding charge voltage (i.e., $U_{max}$) are obtained. Accordingly, the discharge peak and charge peak capabilities of the battery system can be predicted.

However, while the test results obtained through this method can represent the SOP of the battery system under a specific condition, the results are rather limited.

For example, if the SOP is tested at the time when the temperature is set and the SOC is set, the SOP in the adjacent interval may exhibit a jump, so the result obtained accordingly may not be sufficiently accurate.

Besides, the test results obtained through this method merely represent the initial SOP of the battery system, but cannot represent the actual SOP of the battery system throughout the lifetime of the battery system.

Therefore, the test results obtained through this method may be significantly different from practical situations, and the battery system is unable to maximize its performance in practical use by adopting such test results. As a result, the energy of the battery system is wasted.

Figure 1:
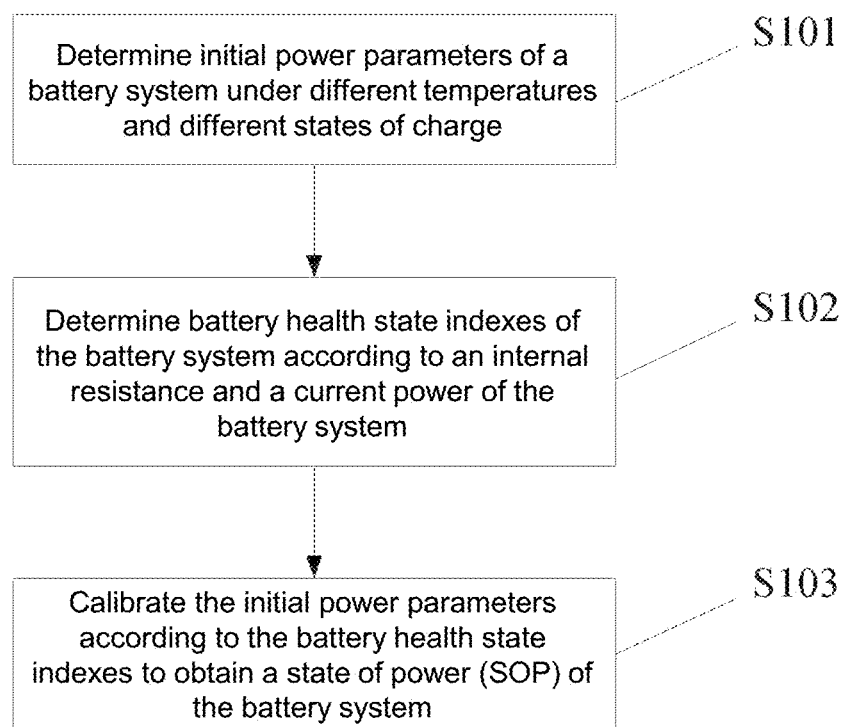
FIG. 1 is a flowchart illustrating a method for determining a state of power (SOP) of a battery system according to an embodiment of the disclosure.

Thus, an embodiment of the disclosure provides a method for determining the SOP of a battery system. As shown in FIG. 1, the method includes the following steps.

S101: Determine initial power parameters of the battery system under different temperatures and different SOCs.

The initial power parameters may include the initial discharge peak power, the initial discharge rated power, the initial charge peak power, and the initial charge rated power.

The two indexes, i.e., temperature and SOC, may be set based on practical needs, as long as the initial power parameters can be accurately determined. The disclosure is not particularly limited in this regard.

S102: Determine battery health state indexes of the battery system according to the internal resistance and the current power of the battery system.

The current power of the battery system may be construed as the actual power of the battery system at the current moment. For example, if the battery system is in a discharging stage, the current power of the battery system is the actual power at a moment in the discharging stage. For example, if the battery system is in a charging stage, the current power of the battery system is the actual power at a moment in the charging stage.

S103: Calibrate the initial power parameters according to the battery health state indexes to obtain the SOP of the battery system.

The calibrated initial power parameters may include the calibrated discharge peak power, the calibrated discharge rated power, the calibrated charge peak power, and the calibrated charge rated power.

The SOP of the battery system may be construed as the maximum power which the battery is able to undertake under a time t (any time), a specific temperature T, and a specific SOC. In other words, under the specific temperature and the specific SOC, the maximum power which the battery is able to undertake varies as time varies. The maximum power which the battery is able to undertake may be the peak power or the rated power, depending on the different scenarios. The calibrated initial power parameters are able to represent the capability of the battery for supplying power and therefore able to reflect the performance of the battery system.

In the embodiment of the disclosure, the battery health state indexes determined according to the internal resistance and the current power of the battery system may serve as a calibration index, and the initial power parameters may be calibrated by using the calibration index. The internal resistance of the battery reflects the aging property of the battery system. Therefore, in the embodiment of the disclosure, the initial power parameters are calibrated according to the aging property of the battery system. By doing so, the capability of the battery system for supplying power can be more reliably reflected, so that the battery system can exhibit outstanding performance, and the energy supplied by the battery system can be utilized sufficiently and effectively.

In practice, the battery system may include a plurality of battery cells. The battery cells may be connected in serial and parallel connection to form the battery system.

At this time, in order to carry out Step S101, determining the initial power parameters of the battery system under different temperatures and different SOCs according to the embodiment of the disclosure specifically includes: adopting a predetermined power test method to calculate first power parameters of each battery cell under different temperatures and different SOCs, the first power parameters including a first discharge peak power, a first discharge rated power, a first charge peak power, and a first charge rated power; smoothing the first power parameters that are calculated to obtain second power parameters of each battery cell under different temperatures and difference SOCs; calculating the initial power parameters of the battery system under different temperatures and different SOCs based on the serial/parallel connection relationship among the respective battery cells according to the second power parameters of each battery cell that are obtained.

With the simple processes as described above, the initial power parameters can be determined. The above processes not only facilitate the efficiency of determining the SOP but also increase the accuracy of the SOP of the battery system, so that the SOP better fits the performance of the battery system.

The predetermined power test method may be the HPPC test method for batteries. Of course, the predetermined power test method may also be other methods for testing the first power parameters of the respective battery cells under different temperatures and different SOCs that are well-known by people skilled in the art. The disclosure shall not be limited in this regard.

Moreover, optionally, in the embodiment of the disclosure, when smoothing the first power parameters that are calculated, linear interpolation may be carried out for smoothing, so that the power can be output smoothly. Meanwhile, a sudden change or a jump in the data of two adjacent intervals is avoided to prevent the accuracy of the determined SOP from dropping due to the sudden change or the jump, thereby increasing the accuracy in determining the SOP. Accordingly, reference data that are more valuable can be provided for the applications of the battery system.

Figure 2:
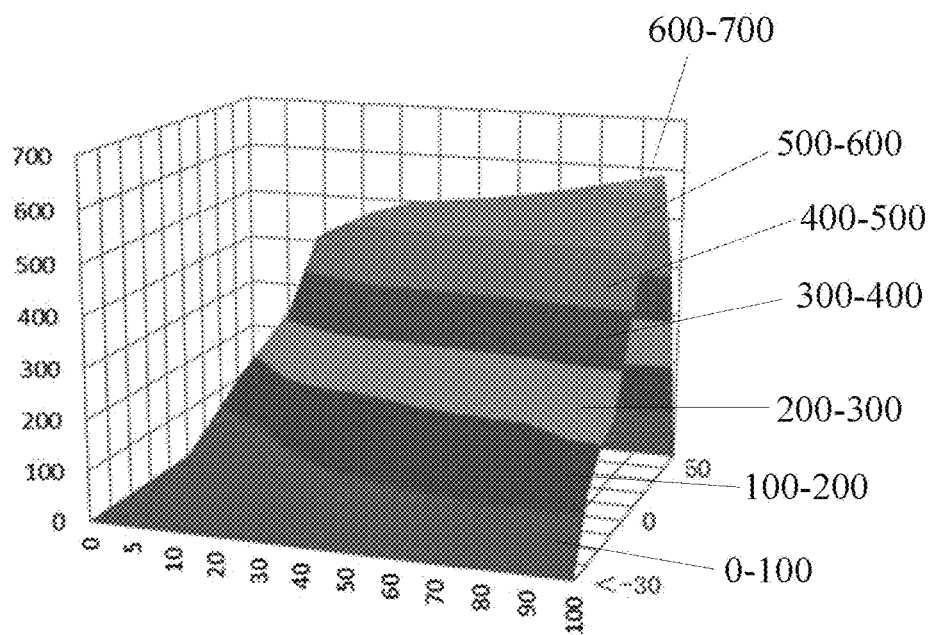
FIG. 2 is a schematic view illustrating results of discharge peak power of a battery cell under different temperatures and different states of charge (SOCs).
Figure 3:
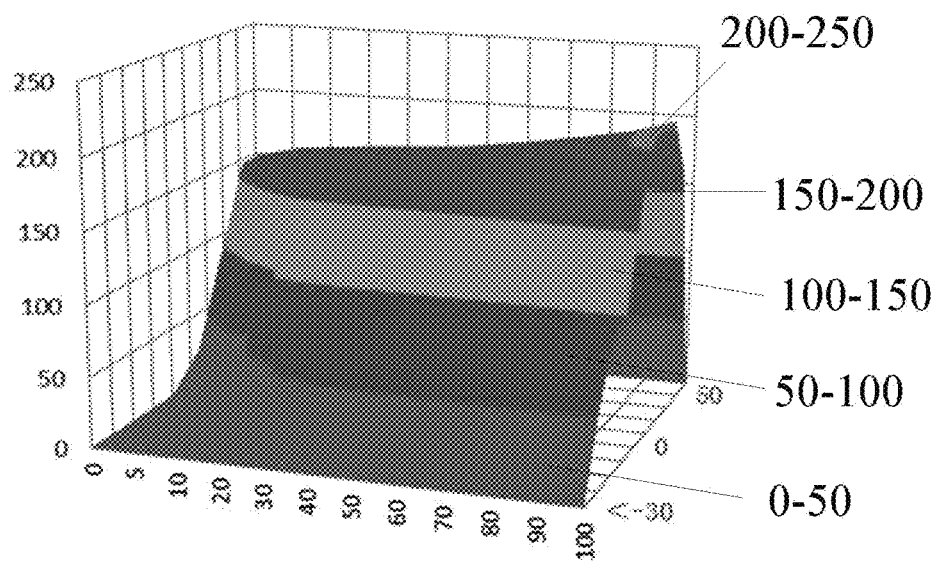
FIG. 3 is a schematic view illustrating results of discharge rated power of a battery cell under different temperatures and different SOCs.
Figure 4:
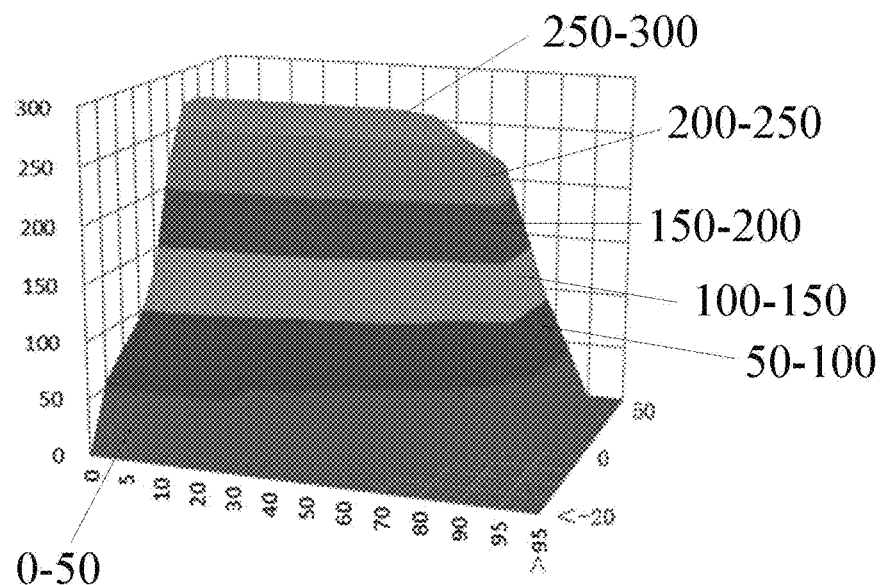
FIG. 4 is a schematic view illustrating results of charge peak power of a battery cell under different temperatures and different SOCs.
Figure 5:
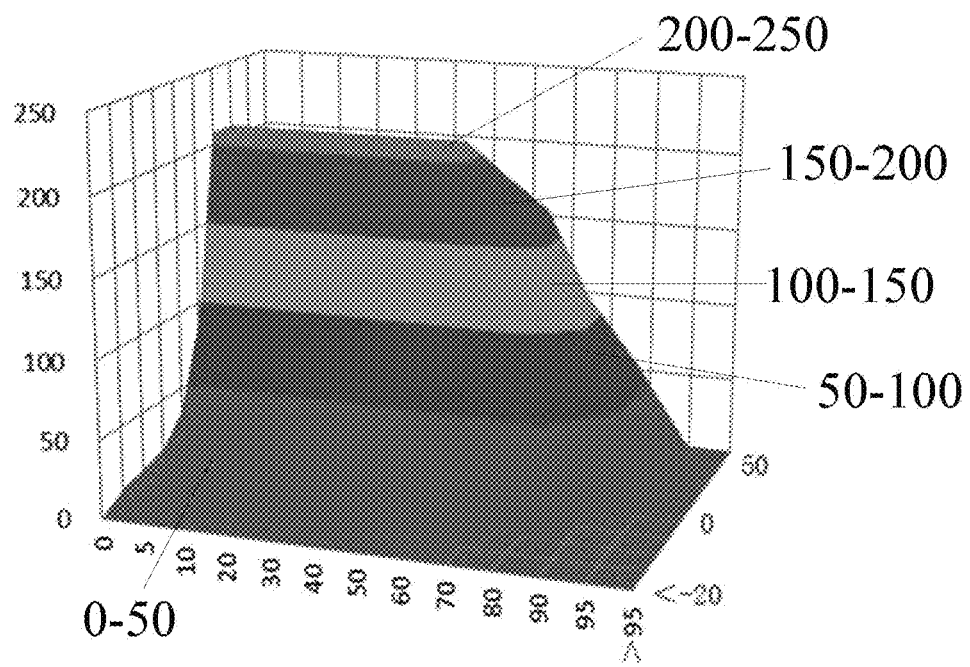
FIG. 5 is a schematic view illustrating results of charge rated power of a battery cell under different temperatures and different SOCs.

The results after processing are as shown in FIGS. 2 to 5. FIG. 2 illustrates the discharge peak power of the battery cell under different temperatures and different SOCs. FIG. 3 illustrates the discharge rated power of the battery cell under different temperatures and different SOCs. FIG. 4 illustrates the charge peak power of the battery cell under different temperatures and different SOCs. FIG. 5 illustrates the charge rated power of the battery cell under different temperatures and different SOCs. The results illustrated in FIGS. 2 to 5 clearly indicate the second power parameters of the battery cell under different temperatures and different SOCs, and the initial power parameters can be conveniently determined by using the second power parameters.

In addition, optionally, the initial power parameters of the battery system may be determined by calculating according to the following equations:

$$Pc\text{-}m(SOC,T,t1)=S1 \times S2 \times P0\text{-}c\text{-}m(SOC,T,t1);$$

$$Pd\text{-}m(SOC,T,t3)=S1 \times S2 \times P0\text{-}d\text{-}m(SOC,T,t3);$$

$$Pc\text{-}r(SOC,T,t2)=S1 \times S2 \times P0\text{-}c\text{-}r(SOC,T,t2);$$

$$Pd\text{-}r(SOC,T,t4)=S1 \times S2 \times P0\text{-}d\text{-}r(SOC,T,t4),$$

wherein T represents a temperature, SOC represents the state of charge, S1 represents the number of battery cells connected in series in the battery system, S2 represents the number of battery cells connected in parallel in the battery system, P0–c–m(SOC, T, t1) represents the initial charge peak power of a battery cell when the temperature is T, the state of charge is SOC, and the time of applying the charge pulse power is t1, P0–d–m(SOC, T, t3) represents the initial discharge peak power of the battery cell when the temperature is T, the state of charge is SOC, and the time of applying the discharge pulse power is t1, P0–c–r(SOC, T, t2) represents the initial charge rated power of the battery cell when the temperature is T, the state of charge is SOC, and the time of applying the charge pulse power is t1, P0–d–r(SOC, T, t4) represents the initial discharge rated power of the battery cell when the temperature is T, the state of charge is SOC, and the time of applying the discharge pulse power is t1, Pc–m(SOC, T, t1) represents the initial charge peak power before calibration when the temperature is T, the state of charge is SOC, and the time of applying the charge pulse power is t1, Pc–r(SOC, T, t2) represents the initial charge rated power before calibration when the temperature is T, the state of charge is SOC, and the time of applying the charge pulse power is t2, Pd–m(SOC, T, t3) represents the initial discharge peak power before calibration when the temperature is T, the state of charge is SOC, and the time of applying the discharge pulse power is t3, and Pd–r(SOC, T, t4) represents the initial discharge rated power before calibration when the temperature is T, the state of charge is SOC, and the time of applying the discharge pulse power is t4.

In practice, in order to carry out Step S102, determining the battery health state indexes according to the internal resistance and the current power of the battery system according to the embodiment of the disclosure specifically includes:

calculating the battery health state indexes of the battery system by adopting formulae as follows:

$$P_1 = U_{max} \times [(C_1 - U_{max})/D_c] \quad \text{Formula 1, or}$$

$$P_2 = U_{min} \times [(C_1 - U_{min})/D_d] \quad \text{Formula 2; and}$$

$$SOH = [(D_{EOL} - D)/(D_{EOL} - D_{BOL})] \times 100\% \quad \text{Formula 3,}$$

wherein $P_1$ represents the current power when the battery system is in the charging stage, $U_{max}$ represents a charge cutoff voltage of the battery system, $C_1$ represents an open circuit voltage under any SOC, $D_c$ represents the internal resistance of the battery system under the current charge power, $P_2$ represents the current power when the battery system is in the discharging stage, $U_{min}$ represents a discharge cutoff voltage of the battery system, $D_d$ represents the internal resistance of the battery system under the current discharge power, SOH represents the battery health state indexes of the battery system, $D_{EOL}$ represents the internal resistance when the lifetime of the battery system ends, $D_{BOL}$ represents an initial internal resistance of the battery system, D represents a current internal resistance of the battery system, the current internal resistance of the battery system when the battery system is in the charging stage is the internal resistance of the battery system under the current charge power, and the current internal resistance of the battery system when the battery system is in the discharging stage is the internal resistance of the battery system under the current discharge power.

In practical situations, if the battery system is in the charge state, only the calculation based on Formula 1 is required, and it is not necessary to conduct the calculation based on Formula 2, and if the battery system is in the discharge state, only the calculation based on Formula 2 is required, and it is not necessary to conduct the calculation based on Formula 1. As a result, the power consumption of the system can be reduced.

In other words, regarding Formulae 1 to 3, when the battery system is in the discharging stage, the internal resistance $D_d$ of the battery system at a certain moment in the discharging stage is first determined according to Formula 2. The internal resistance $D_d$ so determined is then determined as the current internal resistance D of the battery system, that is $D=D_d$. Then, by substituting the determined internal resistance $D_d$ into Formula 3, the battery health state indexes of the battery system at the moment can be determined.

When the battery system is in the charging stage, the internal resistance $D_c$ of the battery system at a certain moment in the charging stage is first determined according to Formula 1. The internal resistance $D_c$ so determined is then determined as the current internal resistance D of the battery system, that is $D=D_c$. Then, by substituting the determined internal resistance $D_c$ into Formula 3, the battery health state indexes of the battery system at the moment can be determined.

The internal resistance property of the battery system affects the output power of the battery system. Therefore, the internal resistance property is one of the important parameters for evaluating the SOP of a battery, and the battery health state indexes reflect the aging degree of the battery system.

Therefore, the formulae (e.g., Formula 1 and Formula 2) for determining $P_1$ and $P_2$ can be derived based on the test method of HPPC based on the battery equivalent circuit model (i.e., the Rint model). Since $C_1$ under a specific SOC may be set as a fixed value, $U_{max}$ may be set as a fixed value, and $U_{min}$ may be set as a fixed value, it can be determined that the internal resistance of the battery system is negatively correlated with the current power (including the current charge power and the current discharge power) of the battery system.

In other words, the current power of the battery system is lower if the internal resistance of the battery system is higher, whereas the current power of the battery system is higher if the internal resistance of the battery system is lower.

Therefore, through the relationship between internal resistance and power, it can be determined that the internal resistance of the battery system and the current power of the battery system are in a linear relationship.

In addition, since internal resistance is commonly used as a characteristic in determining the health state index of a battery, the formula for determining SOH (i.e., Formula 3) can be derived. Since $D_{EOL}$ may be set as a fixed value, and $D_{BOL}$ may be set as a fixed value, it can be determined that SOH is negatively correlated with the current internal resistance of the battery system.

In other words, SOH is smaller if the internal resistance of the battery system is higher, whereas SOH is greater if the internal resistance of the battery system is lower.

Therefore, through the relationship between internal resistance and SOH, it can be determined that the internal resistance of the battery system and SOH are in a linear relationship.

On such basis, it can be determined that SOH and the current power of the battery system are in a linear relationship according to Formulae 1 to 3. Therefore, SOH can be determined according to the current power of the battery system. When the initial power parameters are calibrated by using the SOH so determined, the calibration according to the aging degree of the battery system can be realized. Consequently, the results after calibration can more accurately reflect the performance of the battery system, thereby alleviating the deviation between the SOP of the battery system that is determined and the practical situations.

In practice, in order to carry out Step S103, when the battery health state indexes include a first index, a second index, a third index and a fourth index and the initial power parameters includes the initial discharge peak power, the initial discharge rated power, the initial charge peak power, and the initial charge rated power, and calibrating the initial power parameters according to the battery health state indexes specifically include: multiplying the initial discharge peak power by the first index to obtain a calibrated discharge peak power; multiplying the initial discharge rated power by the second index to obtain a calibrated discharge rated power; multiplying the initial charge peak power by the third index to obtain a calibrated charge peak power; and multiplying the initial charge rated power by the fourth index to obtain a calibrated charge rated power.

Specifically, calibrating the initial power parameters according to the battery health state indexes include: respectively calibrating the initial discharge peak power, the initial discharge rated power, the initial charge peak power, and the initial charge rated power according to formulae as follows:

$$Pc\text{-}m'(SOC,T,t1)=SOH_1 \times Pc\text{-}m(SOC,T,t1);$$

$$Pc\text{-}r'(SOC,T,t2)=SOH_2 \times Pc\text{-}r(SOC,T,t2);$$

$$Pd\text{-}m'(SOC,T,t3)=SOH_3 \times Pd\text{-}m(SOC,T,t3); \text{ and}$$

$$Pd\text{-}r'(SOC,T,t4)=SOH_4 \times Pd\text{-}r(SOC,T,t4),$$

wherein T represents the temperature, SOC represents the state of charge, Pc-m(SOC, T, t1) represents the initial charge peak power before calibration when the temperature is T, the state of charge is SOC, and the time of applying the charge pulse power is t1, Pc-m'(SOC, T, t1) represents the calibrated charge peak power after calibration when the temperature is T, the state of charge is SOC, and the time of applying the charge pulse power is t1, Pc-r(SOC, T, t2) represents the initial charge rated power before calibration when the temperature is T, the state of charge is SOC, and the time of applying the charge pulse power is t2, Pc-r' (SOC, T, t2) represents the calibrated charge rated power after calibration when the temperature is T, the state of charge is SOC, and the time of applying the charge pulse power is t2, Pd-m(SOC, T, t3) represents the initial discharge peak power before calibration when the temperature is T, the state of charge is SOC, and the time of applying the discharge pulse power is t3, and Pd-m'(SOC, T, t3) represents the calibrated discharge peak power after calibration when the temperature is T, the state of charge is SOC, and the time of applying the discharge pulse power is t3, Pd-r(SOC, T, t4) represents the initial discharge rated power before calibration when the temperature is T, the state of charge is SOC, and the time of applying the discharge pulse power is t4, Pd-r'(SOC, T, t4) represents the calibrated discharge rated power after calibration when the temperature is T, the state of charge is SOC, and the time of applying the discharge pulse power is t4, $SOH_1$ represents the first index corresponding to the charge peak power, $SOH_2$ represents the second index corresponding to the charge rated power, $SOH_3$ represents the third index corresponding to the discharge peak power, and $SOH_4$ represents the fourth index corresponding to the discharge rated power.

In this way, after the initial power parameters are calibrated according to the above, the results after calibration can more accurately reflect the performance of the battery system, thereby alleviating the deviation between the SOP of the battery system that is determined and the practical situations. Consequently, the SOP of the battery system can more reliably reflect the capability of the battery system for supplying power, so that the battery system can exhibit outstanding performance and the energy supplied by the battery system can be utilized sufficiently and effectively.

Optionally, in the embodiment of the disclosure, t1 and t2 are related to the charge process of the battery system, t3 and t4 are related to the discharge process of the battery system, t1 and t3 are related to the peak power of the battery system, and t2 and t4 are related to the rated power of the battery system.

Therefore, considering the properties of the battery system, in order to prevent the battery system from being maintained at the peak power and thus damaged and to ensure the battery system is used normally, t1 and t3 may normally be set at 30 s. However, the disclosure is not limited thereto, and t1 and t3 may be set based on practical situations to satisfy the needs under various scenarios and provide flexibility in design.

Differing from t1 to t3, the values of t2 and t4 may be set to be quite large or small. That is, the values of t2 and t4 may be set based on practical situations to satisfy the needs under various scenarios and provide flexibility in design.

Optionally, in the embodiment of the disclosure, the first index, the second index, the third index, and the fourth index are the same.

Accordingly, the process for determining the battery health state indexes can be simplified, and the efficiency of determining the battery health state indexes can be facilitated. As a consequence, the efficiency of determining the SOP can be facilitated.

In practical situations, the first index, the second index, the third index, and the fourth index may also be set to be different from one another, and the specific values for the indexes are not particularly limited. Accordingly, the calibration made to the respective power parameters can be customized and consequently can be more accurate, and the SOP of the battery system can be more accurately determined.

In addition, the calibrated initial power parameters determined according to the above may be applied to the actual operating mode, so as to control the power of the battery system and optimize the operating mode.

Specifically, a method for controlling the power of the battery system may include:

Step 1: Obtain the rated powers of the battery and a current actual power of the battery.

The rated powers and/or the peak powers of the battery are construed as prescribed power parameters. When obtaining the prescribed power parameters of the battery, a battery management system may periodically transmit the prescribed power parameters to a control apparatus, such as, but not limited to, transmitting the prescribed power parameters every 0.1 s, so that the control apparatus obtains the prescribed power parameters.

The prescribed power parameters may be construed as the power parameters predetermined in the battery, such as a predetermined discharge rated power and a predetermined charge rated power.

The current power of the battery may be obtained periodically or obtained at any time. That is, the time when the current power of the battery is obtained may be set based on practical needs. In addition, any process well-known by people skilled in the art for obtaining the current power of the battery may be adopted when obtaining the current power of the battery. The disclosure is not particularly limited in this regard.

Step 2: Adjust the actual power according to a difference between the rated powers and the current actual power when the current actual power is greater than or equal to the rated powers.

In the embodiment of the disclosure, by adjusting the actual power according to a difference between the rated powers and the current actual power, the power output by the battery and the power fed back to the battery can be optimized. Accordingly, the energy of the battery can be utilized effectively to avoid excessive use of the battery while ensuring that the energy released by the battery satisfies the need of the electric vehicle for power. Therefore, the embodiment of the disclosure exhibits crucial effects in facilitating the performance of the electric vehicle, avoiding an operation failure of the battery, elongating the lifetime of the battery, etc.

Optionally, the prescribed power parameters further includes peak powers.

A maximum power output by the battery is controlled to be not greater than the rated powers after a power output by the battery is controlled to drop the power to the rated powers when the current actual power is greater than the peak powers.

Optionally, a maximum power output by the battery is controlled to be not greater than peak powers when the current actual power is less than the rated powers.

Optionally, adjusting the actual power according to the comparison power includes:

controlling a maximum power output by the battery to be not greater than the peak powers, or to drop the power to the rated powers according to the comparison power.

Specifically, a method for controlling the power of the battery system may include:

Step 1: Obtain calibrated rated powers and/or peak powers, and a current actual power of the battery system.

The rated powers and/or peak powers of the battery are construed as prescribed power parameters. The prescribed power parameters after calibration may include the calibrated discharge rated power and the calibrated charge rated power.

When obtaining the prescribed power parameters after calibration of the battery system, a battery system management system may periodically transmit the prescribed power parameters after calibration to a control apparatus, such as, but not limited to, transmitting the prescribed power parameters after calibration every 0.1 s, so that the control apparatus obtains the prescribed power parameters after calibration.

The prescribed power parameters after calibration may be construed as the calibrated power parameters predetermined in the battery system, such as a predetermined calibrated discharge rated power and a predetermined calibrated charge rated power.

The current power of the battery system may be obtained periodically or obtained at any time. That is, the time when the current power of the battery system is obtained may be set based on practical needs. In addition, any process well-known by people skilled in the art for obtaining the current power of the battery system may be adopted when obtaining the current power of the battery system. The disclosure is not particularly limited in this regard.

Step 2: Determine a difference between the peak powers and the rated powers according to the rated powers and the peak powers after calibration.

A difference between the peak powers and the rated powers are construed as a reference power. The reference power may include a discharge reference power or a charge reference power.

Step 3: Determine a difference between the current actual power and the prescribed power parameters according to the prescribed power parameters after calibration and the current actual power.

A difference between the current actual power and the prescribed power parameters is construed as a comparison power. The comparison power may include a discharge comparison power or a charge comparison power.

Step 4: Adjust the actual power according to the reference power and the comparison power.

In the embodiment of the disclosure, by adjusting the actual power according to the reference power and the comparison power, the power output by the battery system and the power fed back to the battery system can be optimized. Accordingly, the energy of the battery system can be utilized effectively to avoid excessive use of the battery system. Meanwhile, it is ensured that the energy released by the battery system satisfies the need of the electric vehicle for power. Therefore, the embodiment of the disclosure exhibits crucial effects in facilitating the performance of the electric vehicle, avoiding an operation failure of the battery system, elongating the lifetime of the battery system, etc.

In practice, when the prescribed power parameters after calibration include the calibrated discharge peak power or the calibrated charge peak power, and the prescribed power parameters after calibration further include the calibrated discharge rated power or the calibrated charge rated power, methods as follows may be adopted to determine the reference power and the comparison power.

Method 1: Optionally, in the embodiment of the disclosure, a difference between the peak powers and the rated powers is determined according to the rated powers and the peak powers after calibration. Specifically, determining a difference between the peak powers and the rated powers according to the rated powers and the peak powers after calibration includes: determining the discharge reference power according to a difference between the calibrated discharge peak power and the calibrated discharge rated power; and determining the charge reference power according to a difference between the calibrated charge peak power and the calibrated charge rated power.

For example, the discharge reference power and the charge reference power may be calculated according to formulae as follows:

$$S_{1\_d}=[Pd\_m'(SOC,T,ta)-Pd\_r'(SOC,T,ta)]\times ta; \text{ and}$$

$$S_{1\_c}=[Pc\_m'(SOC,T,tb)-Pc\_r'(SOC,T,tb)]\times tb,$$

wherein T represents the temperature, SOC represents the state of charge of the battery system, ta represents a time of applying the discharge power to the battery system, tb represents a time of applying the charge power to the battery system, $S_{1\_d}$ represents the discharge reference power, $S_{1\_c}$ represents the charge reference power, Pd_m'(SOC, T, ta) represents the calibrated discharge peak power after calibration when the temperature is T, the state of charge of the battery system is SOC, and the time of applying the discharge power is ta, Pd_r'(SOC, T, ta) represents the calibrated discharge rated power after calibration when the temperature is T, the state of charge of the battery system is SOC, and the time of applying the discharge power is ta, Pc_m'(SOC, T, tb) represents the calibrated charge peak power after calibration when the temperature is T, the state of charge of the battery system is SOC, and the time of applying the charge power is tb, and Pc_r'(SOC, T, tb) represents the calibrated charge rated power after calibration when the temperature is T, the state of charge of the battery system is SOC, and the time of applying the charge power is tb.

It should be noted that the above formulae merely serve as an example to describe the process of calculating the reference power. However, in practical situations, the process of calculating the reference power is not limited thereto, any process should fall within the scope of the embodiments of the disclosure as long as such process can determine the discharge reference power according to the difference between the discharge peak power and the discharge rated power and determine the charge reference power according to the difference between the charge peak power and the charge rated power.

ta may be set as 30 s, but is not limited to 30 s, whereas tb may be set as 10 s, but is not limited to 10 s. In other words, the values of ta and tb may be set according to practical situations to satisfy the needs under various scenarios and provide flexibility in design.

Accordingly, the reference power can be determined through a simple method, and the actual power can be adjusted by using the reference power. As a result, the control over the output power of the battery system can be realized.

Correspondingly and optionally, in the embodiment of the disclosure, determining a difference between the current actual power and the prescribed power parameters according to the prescribed power parameters after calibration and the current actual power specifically includes: performing an integral process on a difference between the current actual power and the calibrated discharge rated power to obtain the discharge comparison power; and performing an integral process on a difference between the current actual power and the calibrated charge rated power to obtain the charge comparison power.

For example, the discharge comparison power and the charge comparison power may be calculated according to formulae as follows:

$$S2\_d=\int_{s1}^{s2}(P0-Pd\_r'(SOC,T,ta))\times dt; \text{ and}$$

$$S2\_c=\int_{s1}^{s2}(P0-Pc\_r'(SOC,T,tb))\times dt,$$

wherein T represents a temperature, SOC represents the state of charge of the battery system, ta represents the time of applying the discharge power to the battery system, tb represents the time of applying the charge power to the battery system, $S2\_d$ represents the discharge comparison power, $S2\_c$ represents the charge comparison power, Pd_r' (SOC, T, ta) represents the calibrated discharge rated power after calibration when the temperature is T, the state of charge of the battery system is SOC, and the time of applying the discharge power is ta, Pc_r'(SOC, T, tb) represents the calibrated charge rated power after calibration when the temperature is T, the state of charge of the battery system is SOC, and the time of applying the charge power is tb, and a1 and a2 are time parameters, and P0 represents the actual power output by the battery system.

Accordingly, the comparison power can be determined through a simple method, and the actual power can be adjusted by using the comparison power. As a result, the control over the output power of the battery system can be realized.

Method 2: Optionally, in the embodiment of the disclosure, a difference between the peak powers and the rated powers is determined according to the rated powers and the peak powers after calibration. Specifically, determining a difference between the peak powers and the rated powers determined according to the rated powers and the peak powers after calibration includes: performing an integral process on the calibrated discharge peak power to determine the discharge reference power; or performing an integral process on the calibrated charge peak power to determine the charge reference power.

When performing the integral process, the integral process mentioned in Method 1 may be adopted. As details in this regard have been described above, the same details will not be repeated in the following.

Correspondingly, in the embodiment of the disclosure, determining a difference between the current actual power and the prescribed power parameters according to the prescribed power parameters after calibration and the current actual power specifically includes: performing an integral process on the current actual power to obtain the discharge comparison power; or performing an integral process on the current actual power to obtain the charge comparison power.

Similarly, when performing the integral process, the integral process mentioned in Method 1 may be adopted. As details in this regard have been described above, the same details will not be repeated in the following.

In practical situations, in addition Method 1 and Method 2 above, other methods may also be adopted to determine the reference power and the comparison power, such as, but not limited to, performing an integral process on a difference between the current actual power and the peak power (including the calibrated discharge peak power or the calibrated charge peak power) to obtain the comparison power or performing an integral process on a ratio between the current actual power and the peak power to obtain the comparison power; or performing an integral process on a ratio between the current actual power and the rated power (including the calibrated discharge rated power or the calibrated charge rated power) to obtain the comparison power, etc. The reference power and the comparison power may also be obtained by performing an averaging process or other processes, such as, but not limited to, performing an averaging process on the difference between the current actual power and the peak power (including the calibrated discharge peak power or the calibrated charge peak power) to obtain the comparison power; or performing an averaging process on the ratio between the current actual power and the peak power to obtain the comparison power; or performing an averaging process on the ratio between the current actual power and the rated power (including the calibrated discharge rated power or the calibrated charge rated power) to obtain the comparison power, etc., just to name a few.

In other words, when determining the reference power and the comparison power, the method may be designed according to practical needs, as long as the reference power and the comparison power can be determined for the subsequent adjustment to the actual power. The disclosure does not intend to impose a specific limitation on the specific details of the determining method.

In the following, the discharge peak power may be construed as the calibrated discharge peak power, the charge peak power may be construed as the calibrated charge peak power, the discharge rated power may be construed as the calibrated discharge rated power, and the charge rated power may be construed as the calibrated charge rated power.

In practice, according to the embodiment of the disclosure, adjusting the actual power according to the reference power and the comparison power includes: adjusting the actual power according to the reference power and the comparison power under the condition that a predetermined control rule is satisfied. The predetermined control rule may include that, within a prescribed time, an actual polarization voltage of the battery system is not greater than a maximum polarization voltage of the battery system, and an actual amount of accumulated heat is not greater than a maximum amount of accumulated heat of the battery system. The prescribed power parameters after calibration include the calibrated discharge peak power or the calibrated charge peak power, and the prescribed time is the time adopted for determining the calibrated discharge peak power.

When considering the power properties of the battery system, the following two factors require consideration:
1) the polarization voltage of the battery system; and
2) the accumulated heat of the battery system.

Assuming that the comparison power and the reference power are equal, the following relations need to be satisfied:

$$\Delta U_{max}(t0) \geq \Delta Us(t); \text{ and}$$

$$I_{max}^2 \times R \times t0 \geq Is^2 \times R \times t,$$

wherein t represents time, and the value range of t is set as [0, t0], t0 being the prescribed time, $\Delta U_{max}(t0)$ represents the maximum polarization voltage of the battery system within the prescribed time, $\Delta Us(t)$ represents the actual polarization voltage of the battery system within the arbitrary time t, $I_{max}^2 \times R \times t0$ represents the amount of accumulated heat of the battery system within the prescribed time, $Is^2 \times t$ represents the actual amount of accumulated heat of the battery system within the arbitrary time t, Is represents a current generated by the battery system at the arbitrary time t, $I_{max}$ represents the maximum current generated by the battery system, and R represents the internal resistance of the battery system under a specific temperature, a specific SOC, and a specific current.

The prescribed time is the time adopted for determining the discharge peak power, and may be determined by referring to HPCC when determining the discharge peak power of the battery system. Therefore, the prescribed time is normally set as 30 s. However, the disclosure is not limited thereto, and the prescribed time may also be set based on practical situations.

Regarding the polarization voltage, due to the polarization phenomenon inside the battery system, the battery system may generate a polarization voltage through use of the battery system. If the polarization voltage is higher, the performance of the battery system is lower, and the power that is actual output is decreased.

Regarding the accumulated heat, the battery system may generate heat through use of the battery system. A larger amount of accumulated heat in the battery system within the prescribed time indicates that the battery system has generated a great amount of heat, so the temperature of the battery system may increase. At this time, the internal structure of the battery system may be damaged, and the performance of the battery system may thus be affected.

Therefore, regardless of the polarization voltage or the accumulated heat, an excessive high value will lead to an adverse effect to the performance of the battery system. Therefore, to ensure that the battery system operates normally to provide more electric energy to the electric vehicle under the condition that the performance remains favorable, the control rule needs to be satisfied during the process of controlling the output power of the battery system, so as to facilitate the performance of the battery system and increase the endurance of the battery system.

In practice, according to the embodiment of the disclosure, adjusting the actual power according to the reference power and the comparison power includes: controlling the maximum power output by the battery system to be not greater than the discharge peak power or to drop the maximum power to the discharge rated power according to the discharge reference power and the discharge comparison power if the battery system is currently in the discharging stage, the actual power is the discharge actual power, the reference power is the discharge reference power, the comparison power is the discharge comparison power, and the prescribed power parameters include the discharge peak power or the discharge rated power; or controlling the maximum power fed back to the battery system to be not greater than the charge peak power or to drop the maximum power to the charge rated power according to the charge reference power and the charge comparison power if the battery system is currently in the charging stage, the actual power is the charge actual power, the reference power is the charge reference power, the comparison power is the charge comparison power, and the prescribed power parameters include the charge peak power or the charge rated power.

The actual power of the battery system may include: the actual power output by the battery system during the discharge process and the actual power fed back to the battery system during the charge process.

Therefore, regarding the discharge process, the maximum power output by the battery system may be construed as the maximum value in the actual power output by the battery system, and regarding the charge process, the maximum power fed back to the battery system may correspondingly be construed as the maximum value in the actual power fed back to the battery system.

Consequently, when the battery system is applied to the electric vehicle, the needs of the electric vehicle for power may be associated with the actual charge and discharge capabilities of the battery system. Thus, the maximum power output by/fed back to the battery system can be dynamically switched between the discharge/charge peak power and the discharge/charge rated power. As a result, an optimized design for the power of the battery system can be realized. Accordingly, the energy of the battery system can be utilized effectively, and the battery system can be prevented from being used excessively. Meanwhile, it is ensured that the energy released by the battery system satisfies the need of the electric vehicle for power. Therefore, the embodiment of the disclosure exhibits crucial effects in facilitating the performance of the electric vehicle, avoiding an operation failure of the battery system, elongating the lifetime of the battery system, etc.

Optionally, in the embodiment of the disclosure, controlling the maximum power output by the battery system to be not greater than the discharge peak power or to drop the maximum power to the discharge rated power according to the discharge reference power and the discharge comparison power specifically includes: determining whether the discharge comparison power is greater than N1 times of the discharge reference power; if the discharge comparison power is not greater than N1 times of the discharge reference power, controlling the maximum power output by the battery system to be not greater than the discharge peak power; if the discharge comparison power is greater than N1 times of the discharge reference power, further determining whether the discharge comparison power is greater than N2 times of the discharge reference power; if the discharge comparison power is greater than N2 times of the discharge reference power, controlling the maximum power output by the battery system to be not greater than the discharge rated power after controlling the power output by the battery system to drop the power to the discharge rated power; and if the discharge comparison power is not greater than N2 times of the discharge reference power, controlling the maximum power output by the battery system to be not greater than the discharge peak power. Controlling the maximum power fed back to the battery system to be not greater than the charge peak power or to drop the power to the charge rated power according to the charge reference power and the charge comparison power specifically includes: determining whether the charge comparison power is less than N1 times of the charge reference power; if the charge comparison power is not less than N1 times of the charge reference power, controlling the absolute value of the maximum power fed back to the battery system to be not greater than the absolute value of the charge peak power; if the charge comparison power is less than N1 times of the charge reference power, further determining whether the charge comparison power is less than N2 times of the charge reference power; if the charge comparison power is less than N2 times of the charge reference power, controlling the absolute value of the maximum power fed back to the battery system to be not greater than the absolute value of the charge rated power after controlling the absolute value of the power fed back to the power system to drop the absolute value of the power to the absolute value of the charge rated power; if the charge comparison power is not less than N2 times of the charge reference power, controlling the absolute value of the maximum power fed back to the battery system to be not greater than the absolute value of the charge peak power, N1 and N2 being positive numbers, and N1 being smaller than N2. Specifically, N1 and N2 are both positive numbers and less than 1.

According to the above, the maximum power which the battery system allows to output can be dynamically switched between the discharge peak power and the absolute value of the charge peak power, and the maximum power input to the power system can be dynamically switched between the discharge rated power and the absolute value of the charge rated power. The design controls the power output of the battery system while ensuring stable and effective use of the battery system for a long time. Such design serves as an effective example for the applications of battery systems in electric vehicles.

If the battery system is applied to the electric vehicle, the discharge process may be construed as, but not limited to, the traveling process of the electric vehicle. At this time, the discharge peak power, the discharge rated power, and the current actual power during the discharge process may all be defined as positive values. Meanwhile, the charge process may be construed as, but not limited to, the braking process of the electric vehicle. At this time, the charge peak power, the charge rated power, and the current actual power during the charge process may all be defined as negative values. Accordingly, the charge process and the discharge process are distinguished from each other, so as to effectively control the battery system power.

Of course, in practical situations, the charge peak power, the charge rated power, and the current actual power during the charge process may all be defined as positive values and may be set according to practical needs to satisfy the needs under various scenarios and provide flexibility in design.

Besides, in correspondence with the different methods for determining the reference power and the comparison power, the adjustment made to the actual power may differ. Here, the descriptions are made, as example, by using the reference power and the comparison power determined according to Method 1 and Method 2 described above.

Situation 1: Regarding the reference power and the comparison power determined according to Method 1, the discharge process of the battery system is described in the following as an example.

Whether the discharge comparison power is greater than a first threshold is determined.

Since the discharge comparison power determined according to Method 1 is obtained according to the integral of the difference between the current actual power and the discharge rated power, whether the discharge comparison power is greater than the first threshold may be first determined, and then whether the discharge comparison power is greater than N1 times of the discharge reference power is determined, so as to accurately control the actual power output by the battery system.

Regarding the value of the first threshold, the value may be set as 0 or other values, and may be set according to practical situations. The disclosure is not particularly limited in this regard.

If the discharge comparison power is not greater than the first threshold, when the first threshold is zero, the current output power of the battery system is less than the discharge rated power. At this time, for the ease of control, the discharge comparison power may be construed as zero. In addition, in order to allow the electric vehicle to accelerate, climb uphill, etc., during traveling, the maximum power which the battery system allows to output may be controlled as the discharge peak power.

If the discharge comparison power is greater than the first threshold, when the first threshold is zero, the current output power of the battery system is greater than the discharge rated power. At this time, whether the discharge comparison power is greater than N1 times of the discharge reference power may be further determined.

If the discharge comparison power is not greater than N1 times of the discharge reference power, the current output power of the battery system is not the discharge peak power, and the output power is closer to the discharge rated power. Therefore, the maximum power output by the battery system may be controlled to be not greater than the discharge peak power, so that the electric vehicle can accelerate, climb uphill, etc., during traveling.

If the discharge comparison power is greater than N1 times of the discharge reference power, whether the discharge comparison power is greater than N2 times of the discharge reference power may be further determined.

If the discharge comparison power is greater than N2 times of the discharge reference power, the current output power of the battery system is relatively large, and the output power is possibly the discharge peak power. If the battery system outputs a greater power for a long time, the battery system may be used excessively, the power may be lost rapidly, and the polarization voltage and the amount of accumulated heat of the battery system may increase, which cause adverse effects to the performance of the battery system. Therefore, at this time, the output power of the battery system may be controlled to drop to the discharge rated power, then the maximum power output by the battery system may be controlled to be not greater than the discharge rated power.

If the output power of the battery system is to be dropped from the current output power to the discharge rated power, to ensure smooth transition of the output power of the battery system and stable traveling of the electric vehicle, such a process may specifically include controlling the battery system to smoothly drop the output power from the current output power to the discharge rated power at a first predetermined rate.

In addition, the value of the first predetermined rate is not particularly limited herein, but may be set according to practical situations, so as to satisfy the needs under various scenarios and provide flexibility in design.

If the discharge comparison power is not greater than N2 times of the discharge reference power, the maximum power output by the battery system may be controlled to be not greater than the discharge peak power, so that the electric vehicle can accelerate, climb uphill, etc., during traveling.

Figure 6:
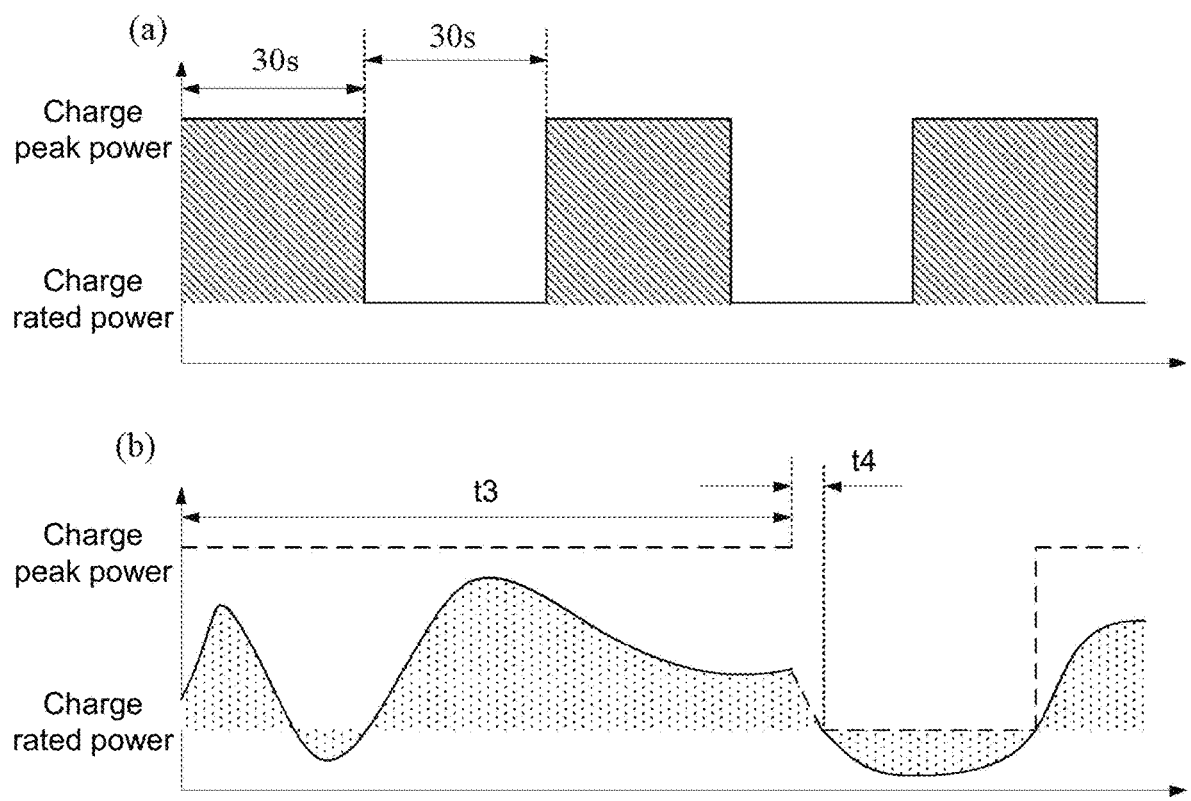
FIG. 6 is a schematic diagram illustrating dynamically adjusting a battery output power according to an embodiment of the disclosure.

For example, as shown in FIG. 6, part (a) in FIG. 6 is a schematic diagram illustrating the output power of the battery system during an experimental stage, and part (b) in FIG. 6 is a schematic diagram illustrating the output power of the battery system during the operating mode.

In part (a) of FIG. 6, the duration during which the battery system outputs the discharge peak power is 30 s, and the duration during which the battery system outputs the discharge rated power is also 30 s. The battery system alternately outputs the discharge peak power and the discharge rated power. In addition, the regions filled with oblique lines represent the discharge reference power.

In part (b) of FIG. 6, the broken line represents the power which the battery system is able to undertake, that is, the maximum power which the battery system allows to output. The regions filled with sparse dots represent the discharge comparison power. There are two time intervals, which are t3 and t4, before the output power of the battery system becomes the discharge rated power. t3 may be, but not limited to, greater than or equal to 24 s, and t4 may be, but not limited to, less than or equal to 12 s. During the time interval t4, the power output by the battery system drops at the first predetermined rate until the discharge rated power.

By controlling and adjusting the power output by the battery system, the power output by the battery system varies within the power range which the battery is able to undertake, the power output by the battery system is controlled while the battery system is ensured to operate effectively and normally. Accordingly, an optimized design of the operating mode of the battery system is realized.

Similarly, the charge process of the battery system follows a principle similar to the principle described in the above example. As the details have been described above, the same details will not be reiterated in the following.

Before determining whether the charge comparison power is less than N1 times of the charge reference power, whether the charge comparison power is less than a second threshold also needs to be determined first.

The charge comparison power, the charge peak power, and the current actual power of the battery system in the charging stage of the battery system are all negative values.

Regarding the value of the second threshold, the value may be set as 0 or other values, and may be set according to practical situations. The disclosure is not particularly limited in this regard.

If the charge comparison power is not less than the second threshold, when the second threshold is zero, the current power fed back to the battery system is less than the charge rated power. At this time, for the ease of control, the charge comparison power may be construed as zero. In addition, the maximum power fed back to the battery system may be controlled as the charge peak power.

If the charge comparison power is less than the second threshold, whether the discharge comparison power is greater than N1 times of the discharge reference power may be further determined.

In addition, depending on the discharge process, controlling the absolute value of the power fed back to the battery system to drop the absolute value of the power to the absolute value of the charge rated power may be realized by controlling the absolute value of the current power fed back to the battery system to drop smoothly to the absolute value of the charge rated power at a second predetermined rate.

In addition, the value of the second predetermined rate is not particularly limited. The first predetermined rate and the second predetermined rate may be set to be the same or different, and may be set according to practical situations, so as to satisfy the needs under various scenarios and provide flexibility in design.

Figure 7:
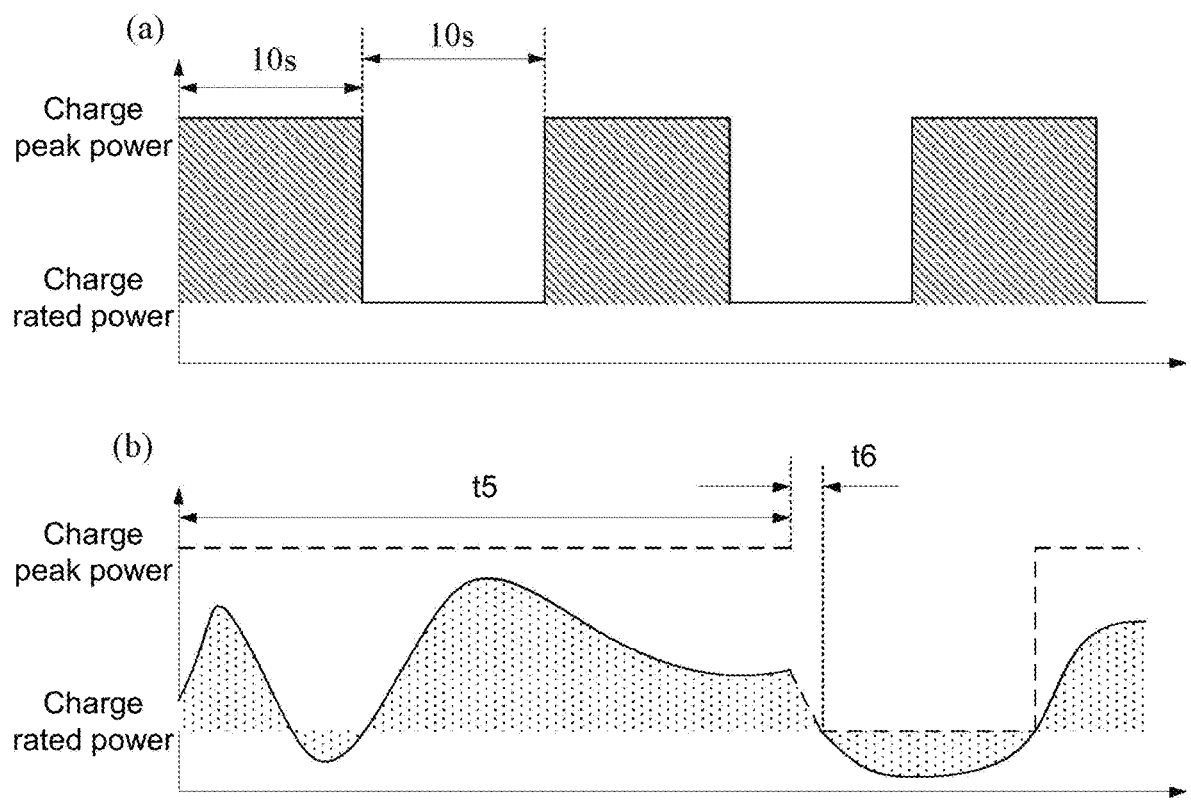
FIG. 7 is a schematic diagram illustrating dynamically adjusting a power fed back to a battery according to an embodiment of the disclosure.

As shown in FIG. 7, part (a) in FIG. 7 is a schematic diagram illustrating the absolute value of the power fed back to the battery system during the experimental stage, and part (b) in FIG. 7 is a schematic diagram illustrating the absolute value of the power fed back during the operating mode of the battery system.

In part (a) of FIG. 7, the duration during which the charge peak power is fed back to the battery system is 30 s, and the duration during which the charge rated power is fed back is also 30 s. The absolute value of the charge peak power and the absolute value of the charge rated power are alternately fed back to the battery system. In addition, the regions filled with oblique lines represent the absolute value of the charge reference power.

In part (b) of FIG. 7, the broken line represents the absolute value of the power which the battery system is able to undertake, that is, the absolute value of the maximum power fed back to the battery system. The regions filled with sparse dots represent the absolute value of the charge comparison power. There are also two time intervals, which are t5 and t6, before the absolute value of the power fed back to the battery system becomes the absolute value of the charge rated power. t5 may be, but not limited to, greater than or equal to 8 s, and t6 may be, but not limited to, less than or equal to 4 s. During the time interval t6, the absolute value of the power fed back to the battery system drops at the second predetermined rate until the absolute value of the charge rated power.

By controlling and adjusting the power fed back to the battery system, the power fed back to the battery system varies within the power range which the battery is able to undertake, and the power output to the battery system is controlled and optimized while the battery system is ensured to operate effectively and normally.

In the embodiment of the disclosure, when setting the values of N1 and N2, the smooth transition of the power output by the battery system needs to be considered to ensure normal and stable traveling of the electric vehicle, while the wearing of the battery system and the impact on the lifetime of the battery system when the battery system operates at full power for a long time also needs to be taken into consideration.

Therefore, the values of N1 and N2 may be set based on the needs according to actual road conditions, such as road conditions in the mountains, cities, suburbs, etc., and may be determined by modulating the calibration parameters and adjusting the output times of the peak power and the rated power, so as to be adapted to various road conditions.

Situation 2: Regarding the reference power and the comparison power determined in Method 2, since the reference power is obtained after performing an integral process on the peak power, the comparison power is obtained after performing an integral process on the current actual power, and no difference is involved, it is not necessary to determine whether the discharge comparison power is greater than zero or it is not necessary to determine whether the charge comparison power is less than zero, and whether the discharge comparison power is greater than N1 times of the discharge reference power may be directly determined or whether the charge comparison power is less than N1 times of the charge reference power may be directly determined.

How the values of N1 and N2 are set in Situation 2 may be different from how the values of N1 and N2 are set in Situation 1, and the values of N1 and N2 in Situation 2 may be set according to practical situations. In addition, the setting of the values of N1 and N2 in different situations may be similar. Details in this regard have been described in the foregoing, so the same details will not be reiterated in the following.

Optionally, in the embodiment of the disclosure, after determining that the discharge comparison power is not greater than N1 times of the discharge reference power and before controlling the maximum power output by the battery system to be not greater than discharge peak power, the embodiment further includes maintaining the value of a first flag representing a discharge degree at a first initial value. In addition, after determining that the discharge comparison power is greater than N2 times of the discharge reference power and before controlling the power output by the battery system to drop the power to the discharge rated power, the embodiment further includes setting the value of the first flag as a first predetermined value. Or, after determining that the charge comparison power is not less than N1 times of the charge reference power and before controlling the absolute value of the maximum power fed back to the battery system is not greater than the absolute value of the charge peak power, the embodiment further includes maintaining the value of a second flag representing a charge degree at a second initial value. In addition, after determining that the charge comparison power is less than N2 times of the charge reference power and before controlling the absolute value of the power fed back to the battery system to drop the absolute value of the power to the absolute value of the charge rated power, the embodiment further includes setting the value of the second flag as a second predetermined value.

In other words, by introducing the first flag during the discharge process, after determining that the discharge comparison power is not greater than N1 times of the discharge reference power, the current actual power output situation of the battery system can be labeled by using the value of the first flag, so as to make a determination quickly in the subsequent adjustment and control processes, thereby making the adjustment and control more efficient.

Similarly, by introducing the second flag during the charge process, after determining that the charge comparison power is not greater than N1 times of the charge reference power, the current actual power feedback situation of the battery system can be labeled by using the value of the second flag, so as to make a determination quickly in the subsequent adjustment and control processes, thereby making the adjustment and control more efficient.

Furthermore, in the embodiment of the disclosure, after determining that the discharge comparison power is greater than N1 times of the discharge reference power, the embodiment further includes determining whether the value of the first flag is the first initial value. If the value of the first flag is the first initial value, whether the discharge comparison power is greater than N2 times of the discharge reference power is determined. If the value of the first flag is not the first initial value, the maximum power output by the battery system is controlled to be not greater than the discharge rated power after controlling the power output by the battery system to drop the power to the discharge rated power.

Or, after determining that the charge comparison power is less than N1 times of the charge reference power, the embodiment further includes determining whether the value of the second flag is the second initial value. If the value of the second flag is the second initial value, whether the charge comparison power is less than N2 times of the charge reference power is determined. If the value of the second flag is not the second initial value, the absolute value of the maximum power fed back to the battery system is controlled to be not greater than the absolute value of the charge rated power after controlling the absolute value of the power fed back to the power system to drop the absolute value of the power to the absolute value of the charge rated power.

In other words, in the discharge process, after determining that the discharge comparison power is greater than N1 times of the discharge reference power, a quick determination may be made according to the value of the first flag, so as to determine whether to control the power output by the battery system to drop the power to the discharge rated power, thereby facilitating the dynamic switching efficiency, i.e., facilitating the efficiency to adjust and control the power of the battery system, while realizing dynamic switching of the maximum power output by the battery system between the discharge peak power and the discharge rated power.

Similarly, in the charge process, after determining that the charge comparison power is greater than N1 times of the charge reference power, a quick determination may be made according to the value of the second flag, so as to determine whether to control the absolute value of the power fed back to the battery system to drop the absolute value of the power to the absolute value of the charge rated power, thereby facilitating the dynamic switching efficiency, i.e., facilitating the efficiency to adjust and control the power of the battery system, while realizing control for the dynamic switching of the absolute value of the maximum power fed back to the battery system between the absolute value of the charge peak power and the absolute value of the charge rated power.

Figure 8:
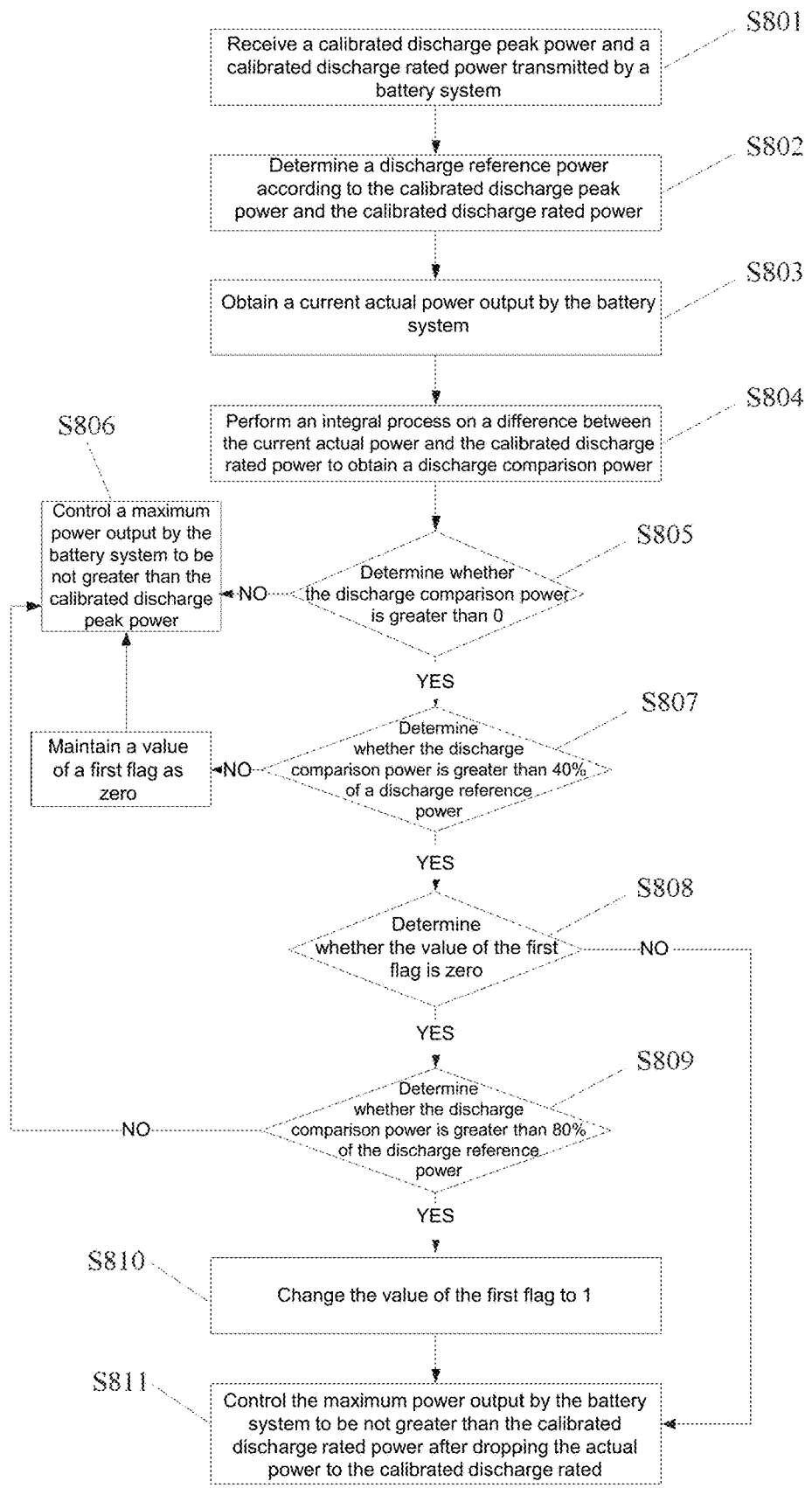
FIG. 8 is a flowchart illustrating a method according to Example 1.

Example 1: The following descriptions are made, as an example, according to the discharge process of the battery system and the discharge reference power and the discharge comparison power determined according to Method 1. In the example, N1 is 40%, N2 is 80%, and the descriptions are made with reference to the flowchart of FIG. 8 illustrating a method.

S801: Receive the calibrated discharge peak power and the calibrated discharge rated power transmitted by the battery system.

S802: Determine the discharge reference power according to the calibrated discharge peak power and the calibrated discharge rated power.

S803: Obtain the current actual power output by the battery system.

S804: Perform an integral process on the difference between the current actual power and the calibrated discharge rated power to obtain the discharge comparison power.

S805: Determine whether the discharge comparison power is greater than 0, perform Step S806 if the discharge comparison power is not greater than 0, and perform Step S807 if the discharge comparison power is greater than 0.

S806: Control the maximum power output by the battery system to be not greater than the calibrated discharge peak power and end the flow.

S807: Determine whether the discharge comparison power is greater than 80% of the discharge reference power, perform Step S808 if the discharge comparison power is greater than 80% of the discharge reference power, and maintain the value of the first flag as 0 and perform S806 if the discharge comparison power is not greater than 80% of the discharge reference power, wherein the initial value of the first flag may be set as 0.

S808: Determine whether the value of the first flag is 0, perform Step S809 if the value of the first flag is 0, and perform Step S811 if the value of the first flag is not 0.

S809: Determine whether the discharge comparison power is greater than 80% of the discharge reference power, perform Step S810 if the discharge comparison power is greater than 80% of the discharge reference power, and perform Step S806 if the discharge comparison power is not greater than 80% of the discharge reference power.

S810: Change the value of the first flag to 1.

S811: Control the maximum power output by the battery system to be not greater than the calibrated discharge rated power after dropping the actual power to the calibrated discharge rated power at a rate r.

Figure 9:
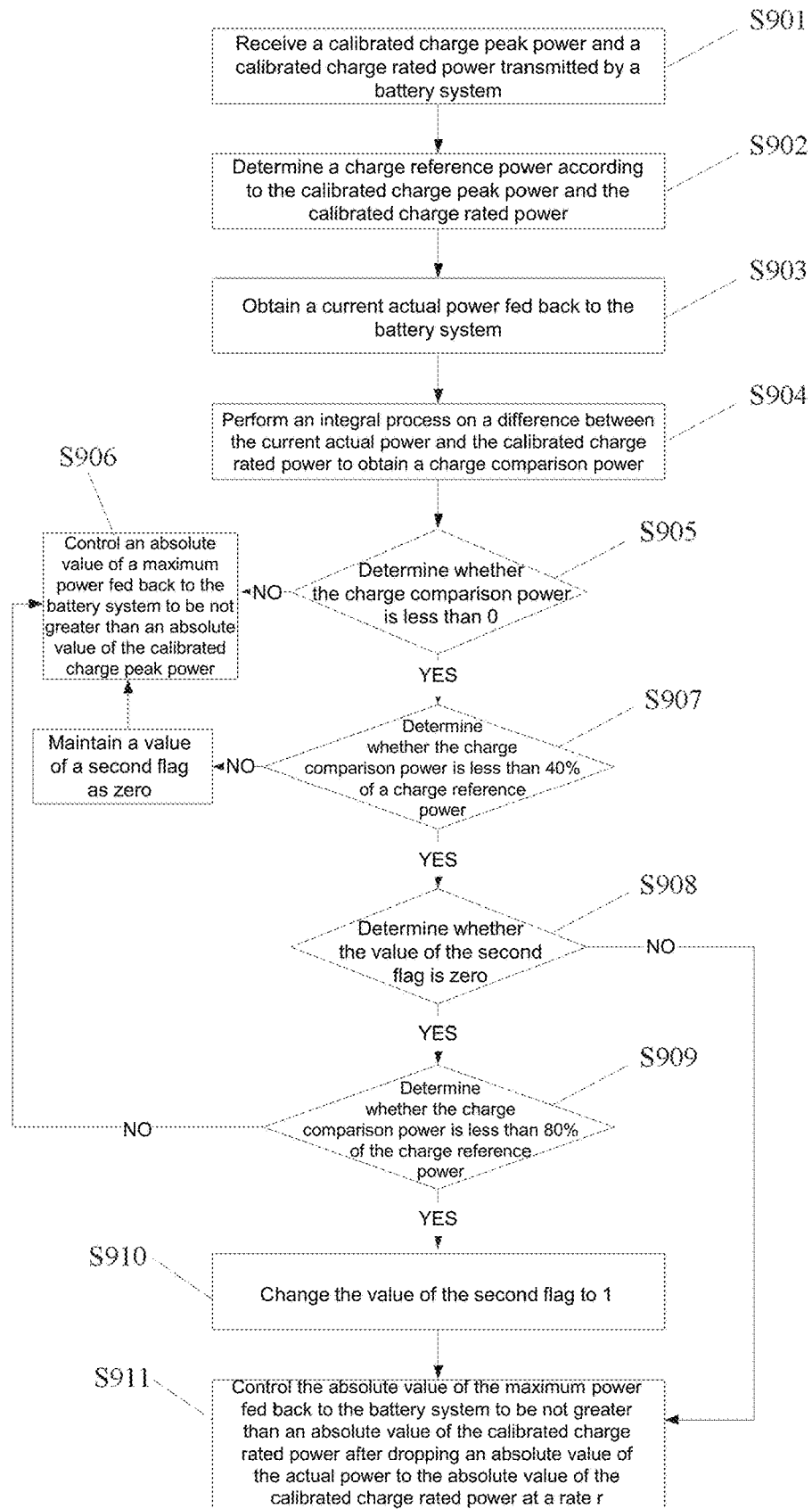
FIG. 9 is a flowchart illustrating a method according to Example 2.

Example 2: The following descriptions are made, as an example, according to the feedback process to the battery system and the charge reference power and the charge comparison power determined according to Method 1. In the example, N1 is 40%, N2 is 80%, and the descriptions are made with reference to the flowchart of FIG. 9 illustrating a method.

S901: Receive the calibrated charge peak power and the calibrated charge rated power transmitted by the battery system.

S902: Determine the charge reference power according to the calibrated charge peak power and the calibrated charge rated power.

S903: Obtain the current actual power fed back to the battery system.

S904: Perform an integral process on the difference between the current actual power and the calibrated charge rated power to obtain the charge comparison power.

S905: Determine whether the charge comparison power is less than 0, perform Step S906 if the charge comparison power is not less than 0; and perform Step S907 if the charge comparison power is less than 0.

S906: Control the absolute value of the maximum power fed back to the battery system to be not greater than the absolute value of the calibrated charge peak power and end the flow.

S907: Determine whether the charge comparison power is less than 40% of the charge reference power, perform Step S908 if the charge comparison power is less than 40% of the charge reference power, and maintain the value of the second flag as 0 and perform S906 if the charge comparison power is not less than 40% of the charge reference power, wherein the initial value of the second flag may be set as 0.

S908: Determine whether the value of the second flag is 0, perform Step S909 if the value of the second flag is 0, and perform Step S911 if the value of the second flag is not 0.

S909: Determine whether the charge comparison power is less than 80% of the charge reference power, perform Step S910 if the charge comparison power is less than 80% of the charge reference power, and perform Step S906 if the charge comparison power is not less than 80% of the charge reference power.

S910: Change the value of the second flag to 1.

S911: Control the absolute value of the maximum power fed back to the battery system to be not greater than the absolute value of the calibrated charge rated power after dropping the absolute value of the actual power to the absolute value of the calibrated charge rated power at the rate r.

Figure 10:
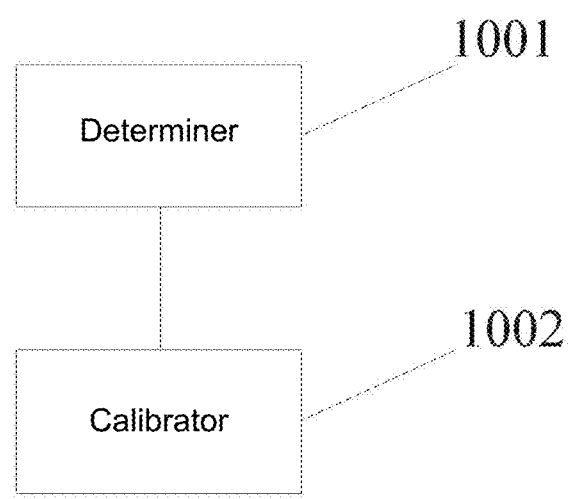
FIG. 10 is a schematic view illustrating a structure of an apparatus for determining the SOP of a battery system according to an embodiment of the disclosure.

Based on the same inventive concept, an embodiment of the disclosure provides an apparatus for determining the SOP of a battery system. As shown in FIG. 10, the apparatus includes: a determiner 1001, configured for determining the initial power parameters of the battery system under different temperatures and different SOCs; and a calibrator 1002, configured for calibrating the initial power parameters according to the battery health state indexes to obtain the SOP of the battery system.

Optionally, in the embodiment of the disclosure, the battery health state indexes include the first index, the second index, the third index and the fourth index, and the initial power parameters include: the initial discharge peak power, the initial discharge rated power, the initial charge peak power, and the initial charge rated power.

Specifically, the calibrator 1002 is configured for: multiplying the initial discharge peak power by the first index to obtain the calibrated discharge peak power; multiplying the initial discharge rated power by the second index to obtain the calibrated discharge rated power; multiplying the initial charge peak power by the third index to obtain the calibrated charge peak power; and multiplying the initial charge rated power by the fourth index to obtain the calibrated charge rated power.

Optionally, in the embodiment of the disclosure, the first index, the second index, the third index, and the fourth index are the same.

Optionally, in the embodiment of the disclosure, the determiner 1001 is configured for: calculating the battery health state indexes of the battery system by adopting formulae as follows:

$$P_1=U_{max}\times[(C_1-U_{max})/D_c], \text{ or } P_2=U_{min}\times[(C_1-U_{min})/D_d];$$

$$SOH=[(D_{EOL}-D)/(D_{EOL}-D_{BOL})]\times100\%,$$

wherein $P_1$ represents the current power when the battery system is in the charging stage, $U_{max}$ represents a charge cutoff voltage of the battery system, $C_1$ represents an open circuit voltage under any SOC, $D_c$ represents the internal resistance of the battery system under the current charge power, $P_2$ represents the current power when the battery system is in the discharging stage, $U_{min}$ represents a discharge cutoff voltage of the battery system, $D_d$ represents the internal resistance of the battery system under the current discharge power, SOH represents the battery health state indexes of the battery system, $D_{EOL}$ represents the internal resistance when the lifetime of the battery system ends, $D_{BOL}$ represents an initial internal resistance of the battery system, D represents a current internal resistance of the battery system, the current internal resistance of the battery system when the battery system is in the charging stage is the internal resistance of the battery system under the current charge power, and the current internal resistance of the battery system when the battery system is in the discharging stage is the internal resistance of the battery system under the current discharge power.

Optionally, in the embodiment of the disclosure, the determiner 1001 is configured for: adopting a predetermined power test method to calculating first power parameters of each battery cell under different temperatures and different SOCs, the first power parameters including a first discharge peak power, a first discharge rated power, a first charge peak power, and a first charge rated power; smoothing the first power parameters that are calculated to obtain second power parameters of each battery cell under different temperatures and difference SOCs; calculating the initial power parameters of the battery system under different temperatures and different SOCs based on the serial/parallel connection relationship among the respective battery cells according to the second power parameters of each battery cell that are obtained.

Based on the same inventive concept, an embodiment of the disclosure provides a battery system. The SOP of the battery system is determined according to the method for determining the SOP of a battery system according to the embodiments of the disclosure.

The battery system may be a lithium ion battery. Of course, the battery system may also be a battery system of any other type, and the disclosure shall not be construed as being limited to a lithium ion battery.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

Other embodiments of the disclosure will be apparent to those skilled in the art from consideration of the specification and practice of the disclosure disclosed herein. The disclosure is intended to cover any variations, uses or adaptations of the disclosure. These variations, uses, or adaptations follow the general principles of the disclosure and include common general knowledge or conventional technical means in the art that are not disclosed in the present disclosure. The specification and embodiments are illustrative, and the real scope and spirit of the present disclosure is defined by the appended claims.

It should be understood that the disclosure is not limited to the precise structures that have been described above and shown in the drawings, and various modifications and variations can be made without departing from the scope thereof. The scope of the disclosure is limited only by the appended claims.

What is claimed is:

1. A method for determining a state of power (SOP) of a battery system, the method comprising:
    determining initial power parameters of the battery system under different temperatures and different states of charge;
    determining battery health state indexes of the battery system according to an internal resistance and a current power of the battery system; and
    calibrating the initial power parameters according to the battery health state indexes to obtain the SOP of the battery system,
    wherein the battery health state indexes comprise a first index, a second index, a third index, or a fourth index, the initial power parameters comprise: an initial discharge peak power, an initial discharge rated power, an initial charge peak power, or an initial charge rated power, and
    calibrating the initial power parameters according to the battery health state indexes comprises:
    multiplying the initial discharge peak power by the first index to obtain a calibrated discharge peak power;
    multiplying the initial discharge rated power by the second index to obtain a calibrated discharge rated power;
    multiplying the initial charge peak power by the third index to obtain a calibrated charge peak power; and
    multiplying the initial charge rated power by the fourth index to obtain a calibrated charge rated power.

2. The method as claimed in claim 1, wherein
    calibrating the initial power parameters according to the battery health state indexes comprises:
    respectively calibrating the initial discharge peak power, the initial discharge rated power, the initial charge peak power, and the initial charge rated power by adopting formulae as follows:

$$Pc\text{-}m(SOC,T,t1)=S1\times S2\times P0\text{-}c\text{-}m(SOC,T,t1);$$

$$Pd\text{-}m(SOC,T,t3)=S1\times S2\times P0\text{-}d\text{-}m(SOC,T,t3);$$

$$Pc\text{-}r(SOC,T,t2)=S1\times S2\times P0\text{-}c\text{-}r(SOC,T,t2);$$

$$Pd\text{-}r(SOC,T,t4)=S1\times S2\times P0\text{-}d\text{-}r(SOC,T,t4),$$

wherein T represents a temperature, SOC represents the state of charge, Pc–m(SOC, T, t1) represents the initial charge peak power before calibration when the temperature is T, the state of charge is SOC, and a time of applying a charge pulse power is t1, Pc–m' (SOC, T, t1) represents a calibrated charge peak power after calibration when the temperature is T, the state of charge is SOC, and the time of applying the charge pulse power is t1, Pc–r(SOC, T, t2) represents the initial charge rated power before calibration when the temperature is T, the state of charge is SOC, and a time of applying the charge pulse power is t2, Pc–r'(SOC, T, t2) represents a calibrated charge rated power after calibration when the temperature is T, the state of charge is SOC, and the time of applying the charge pulse power is t2, Pd–m (SOC, T, t3) represents the initial discharge peak power before calibration when the temperature is T, the state of charge is SOC, and a time of applying a discharge pulse power is t3, and Pd–m'(SOC, T, t3) represents a calibrated discharge peak power after calibration when the temperature is T, the state of charge is SOC, and the time of applying the discharge pulse power is t3, Pd–r(SOC, T, t4) represents the initial discharge rated power before calibration when the temperature is T, the state of charge is SOC, and a time of applying the discharge pulse power is t4, Pd–r'(SOC, T, t4) represents a calibrated discharge rated power after calibration when the temperature is T, the state of charge is SOC, and the time of applying the discharge pulse power is t4, $SOH_1$ represents the first index corresponding to a charge peak power, $SOH_2$ represents the second index corresponding to a charge rated power, $SOH_3$ represents the third index corresponding to a discharge peak power, and $SOH_4$ represents the fourth index corresponding to a discharge rated power.

3. A battery system, wherein a state of power (SOP) of the battery system is determined according to the method as claimed in claim 2.

4. The method as claimed in claim 1, wherein the first index, the second index, the third index, and the fourth index are the same.

5. A battery system, wherein a state of power (SOP) of the battery system is determined according to the method as claimed in claim 4.

6. The method as claimed in claim 1, wherein determining the battery health state indexes of the battery system according to the internal resistance and the current power of the battery system comprises:
calculating the battery health state indexes of the battery system by adopting formulae as follows:

$$P_1 = U_{max} \times [(C_1 - U_{max})/D_c], \text{ or } P_2 = U_{min} \times [(C_1 - U_{min})/D_d];$$

$$SOH = [(D_{EOL} - D)/(D_{EOL} - D_{BOL})] \times 100\%,$$

wherein $P_1$ represents the current power when the battery system is in a charging stage, $U_{max}$ represents a charge cutoff voltage of the battery system, $C_1$ represents an open circuit voltage under any state of charge (SOC), $D_c$ represents the internal resistance of the battery system under a current charge power, $P_2$ represents the current power when the battery system is in a discharging stage, $U_{min}$ represents a discharge cutoff voltage of the battery system, $D_d$ represents the internal resistance of the battery system under a current discharge power, SOH represents the battery health state indexes of the battery system, $D_{EOL}$ represents the internal resistance when a lifetime of the battery system ends, $D_{BOL}$ represents an initial internal resistance of the battery system, D represents a current internal resistance of the battery system, the current internal resistance of the battery system when the battery system is in the charging stage is the internal resistance of the battery system under the current charge power, and the current internal resistance of the battery system when the battery system is in the discharging stage is the internal resistance of the battery system under the current discharge power.

7. A battery system, wherein a state of power (SOP) of the battery system is determined according to the method as claimed in claim 6.

8. The method as claimed in claim 1, wherein the battery system comprises a plurality of battery cells, and determining the initial power parameters of the battery system under different temperatures and different states of charge comprises:
adopting a predetermined power test method to calculated first power parameters of each of the battery cells under different temperatures and different states of charge, wherein the first power parameters comprise a first discharge peak power, a first discharge rated power, a first charge peak power, or a first charge rated power;
smoothing the first power parameters that are calculated to obtain second power parameters of each of the battery cells under different temperatures and different states of charge;
calculating the initial power parameters of the battery system under different temperatures and different SOCs based on a serial/parallel connection relationship among the respective battery cells according to the second power parameters of each of the battery cells that are obtained.

9. A battery system, wherein a state of power (SOP) of the battery system is determined according to the method as claimed in claim 8.

10. A battery system, wherein a state of power (SOP) of the battery system is determined according to the method as claimed in claim 1.

11. An apparatus for determining a state of power (SOP) of a battery system, the apparatus comprising:
a determiner, configured for determining initial power parameters of the battery system under different temperatures and different states of charge, and calibrating the initial power parameters according to battery health state indexes to obtain the SOP of the battery system; and
a calibrator, configured for calibrating the initial power parameters according to the battery health state indexes to obtain the SOP of the battery system,
wherein the battery health state indexes comprise a first index, a second index, a third index, or a fourth index, the initial power parameters comprise: an initial discharge peak power, an initial discharge rated power, an initial charge peak power, or an initial charge rated power, and
the calibrator is configured for:
multiplying the initial discharge peak power by the first index to obtain a calibrated discharge peak power;
multiplying the initial discharge rated power by the second index to obtain a calibrated discharge rated power;
multiplying the initial charge peak power by the third index to obtain a calibrated charge peak power; and
multiplying the initial charge rated power by the fourth index to obtain a calibrated charge rated power.

12. The apparatus as claimed in claim 11, wherein the determiner is configured for:
calculating the battery health state indexes of the battery system by adopting formulae as follows:

$$P_1 = U_{max} \times [(C_1 - U_{max})/D_c], \text{ or } P_2 = U_{min} \times [(C_1 - U_{min})/D_d];$$

$$SOH = [(D_{EOL} - D)/(D_{EOL} - D_{BOL})] \times 100\%,$$

wherein $P_1$ represents the current power when the battery system is in a charging stage, $U_{max}$ represents a charge cutoff voltage of the battery system, $C_1$ represents an open circuit voltage under any state of charge (SOC), $D_c$ represents the internal resistance of the battery system under a current charge power, $P_2$ represents the current power when the battery system is in a discharging stage, $U_{min}$ represents a discharge cutoff voltage of the battery system, $D_d$ represents the internal resistance of the battery system under a current discharge power, SOH represents the battery health state indexes of the battery system, $D_{EOL}$ represents the internal resistance when a lifetime of the battery system ends, $D_{BOL}$ represents an initial internal resistance of the battery system, D represents a current internal resistance of the battery system, the current internal resistance of the battery system when the battery system is in the charging stage is the internal resistance of the battery system under the current charge power, and the current internal resistance of the battery system when the battery system is in the discharging stage is the internal resistance of the battery system under the current discharge power.

\* \* \* \* \*